(12) United States Patent
Zare Hoseini et al.

(10) Patent No.: US 10,601,433 B2
(45) Date of Patent: Mar. 24, 2020

(54) ANALOGUE TO DIGITAL CONVERTER

(71) Applicant: HUAWEI TECHNOLOGIES CO., LTD., Shenzhen, Guangdong (CN)

(72) Inventors: Hashem Zare Hoseini, Cambridge (GB); Feng Wang, Cambridge (GB); Andrzej Radecki, Cambridge (GB)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/287,715

(22) Filed: Feb. 27, 2019

(65) Prior Publication Data
US 2019/0253062 A1    Aug. 15, 2019

Related U.S. Application Data

(63) Continuation of application No. PCT/EP2016/070366, filed on Aug. 30, 2016.

(51) Int. Cl.
*H03M 1/06* (2006.01)
*H03M 1/14* (2006.01)

(52) U.S. Cl.
CPC ......... *H03M 1/0697* (2013.01); *H03M 1/144* (2013.01)

(58) Field of Classification Search
CPC ..... H03M 1/0697; H03M 1/144; H03M 1/468
USPC .................................................. 341/118–155
See application file for complete search history.

(56) References Cited

U.S. PATENT DOCUMENTS

| | | | |
|---|---|---|---|
| 9,154,151 B1* | 10/2015 | Leong ................. | H03M 1/0863 |
| 2009/0309778 A1 | 12/2009 | Yoshinaga | |
| 2015/0038870 A1* | 2/2015 | Yoo ...................... | A61B 5/0476 |
| | | | 600/544 |
| 2015/0194981 A1* | 7/2015 | Tang ..................... | H03M 1/442 |
| | | | 341/172 |
| 2015/0263744 A1* | 9/2015 | Sharma ............... | H03M 1/0678 |
| | | | 341/118 |
| 2016/0134300 A1* | 5/2016 | Wang .................. | H03M 1/0854 |
| | | | 341/172 |

(Continued)

OTHER PUBLICATIONS

International Search Report dated May 3, 2017 in corresponding International Patent Application No. PCT/EP2016/070366 (5 pages).

(Continued)

*Primary Examiner* — Lam T Mai
(74) *Attorney, Agent, or Firm* — Fish & Richardson P.C.

(57) ABSTRACT

An analog to digital converter comprising: a plurality of voltage generators, each voltage generator having a control input and being capable of generating an output whose voltage is dependent on a signal applied to the control input; a comparison stage arranged to compare the input signal with one or more outputs of the voltage generators and generate one or more comparator outputs indicative of the result(s) of the comparison(s); and a controller arranged to receive the comparator outputs, the controller being configured to: (i) signal the control inputs of a number $V_1$ of the voltage generators, and estimate a number $B_1$ of bits of the digital representation; and subsequently (ii) signal the control input(s) of a number $V_2$ of the voltage generators, and estimate a number $B_2$ of bits of the digital representation; wherein $V_2$ is less than $V_1$.

16 Claims, 6 Drawing Sheets

(56) References Cited

U.S. PATENT DOCUMENTS

| | | | |
|---|---|---|---|
| 2016/0254821 A1* | 9/2016 | Luo | H03M 1/125 |
| | | | 341/161 |
| 2016/0336954 A1* | 11/2016 | Tsai | H03M 1/0636 |
| 2017/0026053 A1* | 1/2017 | Lee | H03M 1/1245 |
| 2017/0353192 A1* | 12/2017 | Tsai | H03M 1/1245 |
| 2018/0083645 A1* | 3/2018 | Monangi | H03M 1/0617 |
| 2018/0109747 A1* | 4/2018 | Chae | H03M 1/124 |
| 2018/0269893 A1* | 9/2018 | Chang | H03M 1/0682 |
| 2019/0131989 A1* | 5/2019 | Maurino | H03M 3/47 |

OTHER PUBLICATIONS

Written Opinion of the International Searching Authority dated May 3, 2017 in corresponding International Patent Application No. PCT/EP2016/070366 (11 pages).

International Search Report dated Mar. 5, 2017 in corresponding International Application No. PCT/EP2016/070366.

\* cited by examiner

Figure 4

| | Step 0 (50) | Step 1 (51) | Step 2 (52) | Step 3 (53) |
|---|---|---|---|---|
| REF_H_P | 1000000 | 1110000 | 1101100 | 1101101 |
| REF_H_N | 0000000 | 0000000 | 0010000 | 0010010 |
| REF_P | 000000 *0000000* | 110000 *0000000* | 110100 *0000000* | 110110 *0000000* |
| REF_0 | 111111 *1111111* | 001111 *1111111* | 000011 *1111111* | 000000 *1111111* |
| REF_N | 000000 *0000000* | 000000 *0000000* | 001000 *0000000* | 001001 *0000000* |
| REF_L_P | 0000000 | 1100000 | 1101000 | 1101100 |
| REF_L_N | 1000000 | 0010000 | 0010100 | 0010011 |

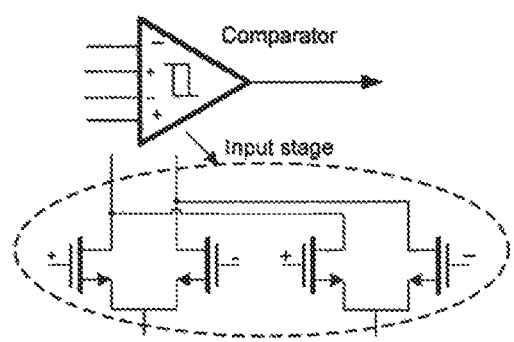

ANALOGUE TO DIGITAL CONVERTER

CROSS-REFERENCE TO RELATED APPLICATIONS

This application is a continuation of International Application No. PCT/EP2016/070366, filed on Aug. 30, 2016, the disclosure of which is hereby incorporated by reference in its entirety.

This application relates to analogue to digital converters ("ADCs").

One known form of ADC is the successive approximation register ADC ("SAR ADC"). In a typical SAR ADC an analogue signal is repeatedly compared with a reference signal so as to form a digital representation of the analogue signal. In a single channel SAR ADC, at each comparison step the reference signal is set so that the result of the comparison indicates the value of the most significant bit of the digital representation that is as yet unknown. In this way the digital representation is build up over successive comparison steps. A problem with this approach is that it takes one cycle to determine each bit of the digital representation. To speed up the process it is possible to estimate multiple bits in parallel by feeding the same input signal to multiple single channel SAR ADC circuits. For example, if two bits are determined in every cycle then a 16-bit digital representation can be formed in only 8 cycles. However, a problem with this approach is that at finer resolutions, as are required for determining the less significant bits of the digital representation, the circuitry needed to form the reference signal needs to be very precise. This circuitry usually has a relatively high power consumption and can occupy significant area on a circuit layout. When this circuitry is duplicated across multiple SAR ADC circuits power consumption and circuit area can be increased considerably over that needed for a single-channel SAR ADC.

When typical a MIMO (multiple input, multiple output) radio is receiving, it is processing multiple received signals in parallel. For a receiver of this type it is a particular priority to have ADCs that are both quick and power-efficient. Similar issues arise in other devices, especially ones that process multiple ADC operations in parallel.

There is a need for an improved design of ADC.

According to one arrangement there is provided an analogue to digital converter for generating a digital representation of the voltage of an input signal, the analogue to digital converter comprising: a plurality of voltage generators, each voltage generator having a control input and being capable of generating an output whose voltage is dependent on a signal applied to the control input;

a comparison stage arranged to compare the input signal with one or more outputs of the voltage generators and generate one or more comparator outputs indicative of the result(s) of the comparison(s); and a controller arranged to receive the comparator outputs, the controller being configured to: (i) signal the control inputs of a number $V_1$ of the voltage generators to cause each of them to generate a respective output, and estimate in dependence on the resulting comparator outputs a number $B_1$ of bits of the digital representation; and subsequently (ii) signal the control input(s) of a number $V_2$ of the voltage generators to cause each of them to generate a respective output, and estimate in dependence on the resulting comparator output(s) a number $B_2$ of bits of the digital representation; wherein $V_2$ is less than $V_1$.

This arrangement may provide an efficient way to form a digital representation of an analogue input signal.

$B_2$ may be less than $B_1$. This can allow requirements on the voltage generators used in step (ii) to be relaxed.

$B_1$ may equal $B_2+1$. This can provide a convenient step down in parallelism between stage (i) and stage (ii).

$V_2$ may be equal to 1. This allows for only a single voltage generator to be used in step (ii), meaning that the performance requirements on all the other voltage generators may be less.

$V_1$ may equal $2^{B_1}-1$. $V_2$ may equal $2^{B_2}-1$. This can allow for an efficient binary-wise determination of the bits of the digital output.

The bits estimated in step (i) may be more significant bits of the digital representation than the bits estimated in step (ii). This allows the bits estimated in step (i) to be used to drive the voltage generator(s) used in step (ii).

The controller may be configured to, in step (i), cause the $V_1$ voltage generators to generate their respective outputs simultaneously. This can allow the output to be formed relatively quickly.

The controller may be configured to, between steps (i) and (ii), perform a step of signalling the control input(s) of a number $V_2$ of the voltage generators to cause each of them to generate a respective output. In dependence on the resulting comparator output(s) the controller may compensate for any offset between that or those voltage generators and voltage generators employed in step (i). This can avoid the need for all the voltage generators to be precisely matched to each other.

The comparison stage may comprise a plurality of comparators. Each comparator may be arranged to compare the input signal with the output of a respective one of the voltage generators. This can provide an efficient circuit layout.

The or each voltage generator employed in step (ii) may be less power efficient than the or each voltage generator employed in step (i) and not in step (ii). This can allow for reduced power usage.

The or each voltage generator employed in step (ii) may be more precise than the or each voltage generator employed in step (i) and not in step (ii). This can allow for more relaxed component tolerances in the voltage generators used only in step (i).

The or each voltage generator employed in step (ii) may be capable of generating voltages at finer resolution than the or each voltage generator employed in step (i) and not in step (ii). This can allow for more relaxed component tolerances in the voltage generators used only in step (i).

The controller may be configured to set the or each voltage generator employed in step (i) and not in step (ii) in a quiescent state during step (ii). This can allow for reduced power usage.

The controller may be configured to perform the step (i) multiple times for a single input signal prior to performing the step (ii) for the same input signal, and to estimate different bits of the digital representation in each iteration of the step (i). This may allow a multiple bits of a digital representation of an input signal to be efficiently determined.

The controller may be configured to perform the step (ii) multiple times for a single input signal after performing the step (i) for the same input signal, and to estimate different bits of the digital representation in each iteration of the step (ii). This may allow a multiple bits of a digital representation of an input signal to be efficiently In another arrangement there is provided a signal receiver comprising a radio frequency input and a sampling circuit for periodically sampling the voltage of a received signal derived from the radio frequency input, the sampling circuit comprising: a plurality of buffers for storing respective samples of the received signal at respective times; and a plurality of analogue to digital converters as set out above, each analogue to digital converter being configured to take the content of a respective buffer as its input signal.

In another arrangement there is provided a method for generating a digital representation of the voltage of an input signal in an analogue to digital converter comprising: a plurality of voltage generators, each voltage generator having a control input and being capable of generating an output whose voltage is dependent on a signal applied to the control input; and a comparison stage arranged to compare the input signal with one or more outputs of the voltage generators and generate one or more comparator outputs indicative of the result(s) of the comparison(s); the method comprising: (i) signalling the control input(s) of a number $V_1$ of the voltage generators to cause each of them to generate a respective output, and estimating in dependence on the resulting comparator output(s) a number $B_1$ of bits of the digital representation; and subsequently (ii) signalling the control input(s) of a number $V_2$ of the voltage generators to cause each of them to generate a respective output, and estimating in dependence on the resulting comparator output(s) a number $B_2$ of bits of the digital representation; wherein $V_2$ is less than $V_1$.

The present application will now be described by way of example with reference to the accompanying drawings.

In the drawings:

FIG. 4 illustrates steps in using the circuit of FIG. 3.

FIG. 6 illustrates a four-input comparator.

Figure 1:
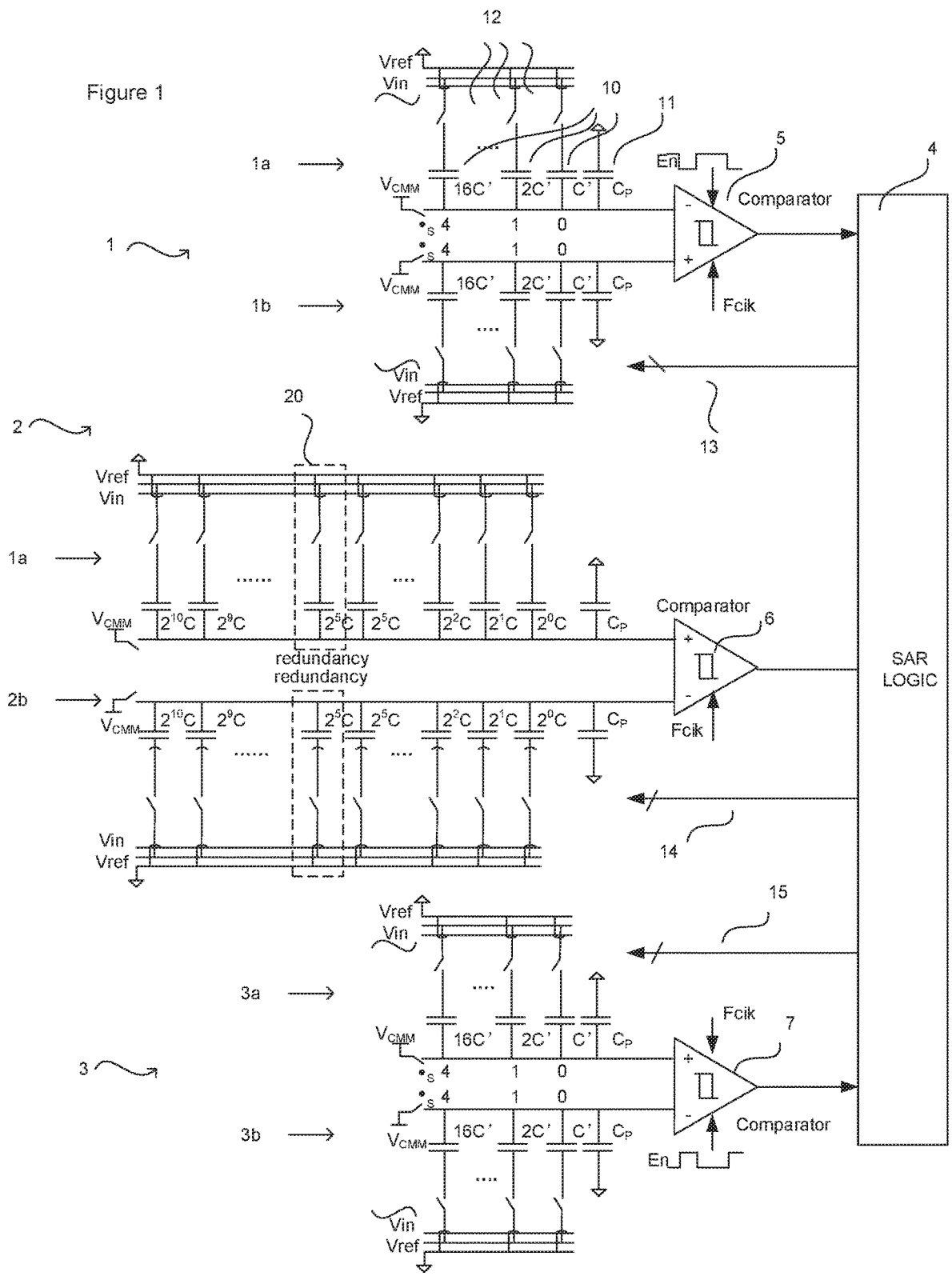
FIG. 1 shows one circuit for a multi-channel SAR ADC.

FIG. 1 shows a circuit for a multi-channel SAR ADC. The circuit comprises first, second and third voltage generators 1, 2, and 3. Associated with each voltage generator is a respective comparator 5, 6 and 7. The outputs of the comparators are fed to a logic unit 4. The circuit receives a signal $V_{in}$ which is an analogue signal of which a digital representation is to be generated.

In this example circuit each voltage generator has two balanced circuits (1a/1b, 2a,2b,3a/3b) for differential operation. The outputs of those circuits are compared in the respective comparator. Referring to circuit 1a of voltage generator 1 as an example, each balanced circuit comprises a series of capacitors 10. The capacitors are configured so that each one apart from the first has twice the capacitance of the previous capacitor, as indicated in FIG. 1 by the designations "C", "2C" or "2⁰C", "2¹C" etc. Other schemes are possible. One leg of each capacitor can be coupled to a selected one of ground, a supply voltage $V_{ref}$ or the input signal $V_{in}$ by a respective switch 12. The switches operate under the control of a selection signal 13 generated by the logic unit 4. The other leg of each capacitor is connected to an input rail 15 which provides one input to the comparator 5.

The process for determining a digital representation of a signal using a single one of the voltage generators will be described. In a first step the switches are controlled to couple all the capacitors to the input signal $V_{in}$. In addition, the top plates of the capacitors are shorted to Vcmm. This samples the input signal on to the capacitors 10. Then the switches are operated to, in the first step after sampling, connect all capacitors to ground. The comparator input voltage is then equal to the inverted input signal. In each subsequent iteration after sampling the largest capacitor (on either side) is connected to Vref. The voltages on the input rails can then be compared in the comparator. The output of the comparator is passed to the logic unit 4 which establishes in dependence on the comparison whether the most significant bit of the desired digital representation is a 0 or a 1. Once the most significant bit is known the process can be repeated with, during the comparison step, the largest capacitor being set to ground or $V_{ref}$ as indicated by the now-known most significant bit value and the next largest capacitor being treated as for the largest in the first step. This process can be repeated to determine all the bits of the digital representation. SAR DACs operating with a single voltage generator of this type are known. Additional non-switched parasitic capacitors can be connected between the input rails and ground.

Other schemes of coupling the capacitors are known, for example the monotonic conversion algorithm in which once the capacitor is connected to VREF it remains connected to it throughout the rest of the conversion cycle.

In the system of FIG. 1 there are three such voltage generators, with respective comparators. Each one is controlled by a separate control signal (13, 14, 15) from the logic unit. The logic unit is configured to use the voltage generators in combination to determine a digital representation of the input signal $V_{in}$ in the manner to be described below. For that purpose the logic unit could be configured in hardware to perform the operations required to achieve that function. Alternatively, or in addition, the logic unit could comprise a processor and a memory storing in a non-transient way software code for execution by the processor to perform the required operations. The logic unit could be a single hardware element or could be split between multiple hardware elements.

In the system of FIG. 1 one of the voltage generators (2) has more switched capacitors than the others (1, 3). In each voltage generator the switched capacitors in each balanced circuit may run in a series arranged as powers of two, with the optional exception of a redundant switched capacitor stage 20 in voltage generator 2. The switched capacitors are selected such that the largest switched capacitors in all of the voltage generators are of substantially the same value: for example the same value plus or minus 5%, 3% or 1%. With this arrangement, if voltage generators 3 and 1 contain N switched capacitors in each of their balanced circuits, whose values run as powers of two, the values of those capacitors are substantially the same as the largest N capacitors in each balanced circuit of the larger voltage generator 2. This means that the three voltage generators can be used in combination to determine two bits of the digital representation of the input signal in parallel. For example, voltage generator 1 and its comparator 5 can be used to distinguish between bit outcomes 00 and 01, voltage generator 2 and its comparator 6 can be used to distinguish between bit outcomes 01 and 10, and voltage generator 3 and its comparator 7 can be used to distinguish between bit outcomes 10 and 11. The logic unit is configured to determine the bit outcome based on the outputs from the parallel comparisons.

Using multiple voltage generators and comparators in parallel in this way can reduce the time required to determine all the bits of the digital output. However, in order for the voltage generator circuit to generate accurate voltages at small capacitances the circuit is normally large or power hungry or both. By reproducing this complication over all the voltage generators these disadvantages would be multiplied. Instead, in the system of FIG. 1, the smaller capacitors are only present in one of the voltage generators (2). The remaining voltage generators (1, 3) only have the larger capacitors. In order to utilise this system, the more significant bits of the digital representation of the input signal are generated using multiple voltage generators and comparators in parallel. Then, the less significant bits are generated using only the voltage generator 2 which has the finer scale capacitors. In this arrangement the voltage generators 1 and 3, which do not have the finer scale capacitors, do not need to be manufactured to the same tolerance and/or stability as the voltage generator 2, and may be of a less power-hungry design than the voltage generator 2.

If the ratios of the capacitances in the finer voltage generator 2 do not exactly match those of the coarser voltage generators 1, 3 it is possible that the least significant bit of the digital representation formed by the voltage generators operating in combination might not match the corresponding bit that would be generated by the finer voltage generator operating alone. To account for this an additional calibration step may be performed when the processing switches from using multiple voltage generators to using fewer. This step makes use of the capacitor stage 20. The additional calibration step will be described with reference to FIG. 2.

Figure 2:
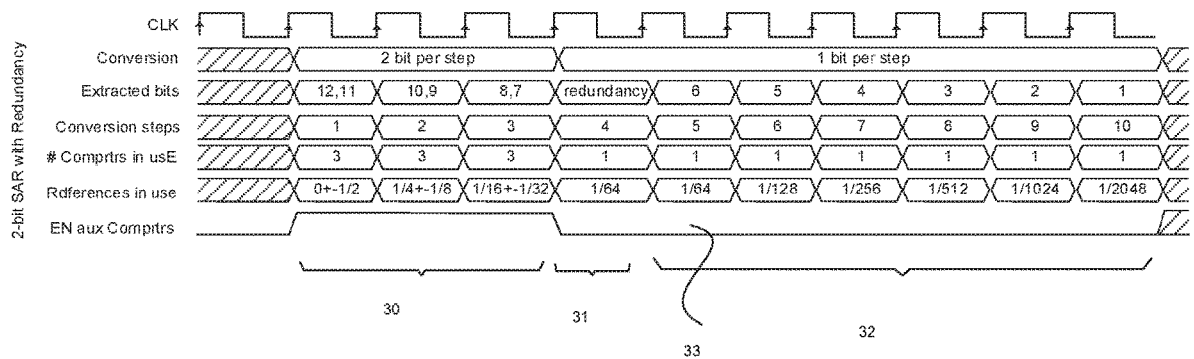
FIG. 2 illustrates steps in a conversion algorithm.

FIG. 2 is a timing diagram showing the formation of a 12-bit digital representation of an analogue input signal. In this example the coarse voltage generators each have six switched capacitor levels, and the fine voltage generator has twelve switched levels plus a redundant level. In a first phase 30, three successive parallel comparisons are performed using all three voltage generators. These yield the six most significant bits of the required digital representation. In a second phase 31 the digital estimate of the six most significant bits is checked against the value estimated by the fine voltage generator. Then in a third phase 32, six successive comparisons using only the fine voltage generator are performed do estimate the six least significant bits. When the final six steps are being performed the coarse voltage generators and/or their comparators can be placed in a low-power state.

The redundancy step will now be described in more detail. At the end of the three parallel steps the digital representation may have been determined to be, say, 100101XXXXXX. Due to potential differences in the values of the capacitors between the voltage generators it is possible that the fine voltage generator used alone might have determined the value to be 100100XXXXXX or 100111XXXXX. In the redundancy step the most significant unknown bit (7th) can be estimated using the fine voltage generator, with the more significant capacitors of that voltage generator loaded corresponding to the previously determined bits (100101). If that operation indicates that the 7th MSB is a 1 then in the next step 33 the system checks whether the six MSBs are 100101 or 100111. Otherwise in the next step 33 the system checks whether the six MSBs are 100100 or 100101. In this way any offset between the voltage venerators can be accounted for. If the voltage generators are precisely matched, or any offset has been learned from previous digitisation operations, then step 33 could be omitted.

In summary, in the first phase of the conversion cycle the SAR ADC of FIG. 1 uses a two-bit-per-step conversion algorithm. In the subsequent, second phase it switches to a one-bit-per step algorithm using a single voltage generator and comparator. Using a two-bit-per step algorithm for part of the process gives a speed advantage over a SAR ADC that operates exclusively in one-bit-per-step mode. Using a one-bit-per-step algorithm for part of the process allows the accuracy, size and/or power consumption of the components that are used only in two-bit-per-step mode to be relaxed. At the circuit level, this can result in one or more of the following benefits: higher speed capability and/or reducing the number of sub-ADCs, avoiding the need for precisely matching the capacitors/comparators between the voltage generators due to the redundancy step, the ability to use capacitors of relatively small size, at least in the coarse voltage generators; a relaxation of the noise/offset requirements for the coarse comparators; power efficiency; relaxation of the requirements on the precision of $V_{ref}$ and faster settling.

As discussed above, in the embodiment of FIG. 1 the input signal $V_{in}$ is sampled into three voltage generators each containing a pair of capacitor banks arranged as powers of two. The fine voltage generator 2 is used in both the two-bit-per-step and the one-bit-per-step phases of the conversion. The two coarse voltage generators are used during the two-bit-per-step phase only. As any residual errors after the two-bit-per-step phase will be corrected in the redundant conversion step (assuming the error amplitude is below the size of the redundant step), sampling mismatches, capacitor mismatches, comparator offsets and noise can be tolerated. In particular, input capacitance is determined mostly by the capacitance of the fine voltage generator as the two coarse voltage generators are much smaller than it.

In the one-bit-per-step phase the two coarse voltage generators and their comparators can be disabled to save power.

In the two-bit-per-step phase, comparison is performed against a set of three reference voltages. For example, in the first step, when the two MSBs are determined, the references voltages are 0, +½*FS and −½*FS, where FS represents full-scale voltage range of the ADC. In the second step, then the third and fourth MSBs are determined then depending on the result of the previous step, the references are:

−¾*FS, (−¾+⅛)*FS, (−¾−⅛)*FS, if the result of previous comparison step is 000. That is, the signal level is below −½*FS.

−¼*FS, (−¼+⅛)*FS, (−¼−⅛)*FS, if the result of previous comparison step is 001. That is, the signal level is between −½*FS and 0.

¼*FS, (¼+⅛)*FS, (¼−⅛)*FS, if the result of previous comparison step is 011. That is, the signal level is between 0 and ½*FS.

¾*FS, (¾+⅛)*FS, (¾−⅛)*FS, if the result of previous comparison step is 111. That is, the signal level is above ½*FS.

In the embodiment of FIG. 1, the coarse voltage generators are driven by different digital code words at 13, 15 from the logic unit 4. This has the advantage that it allows the references to be chosen arbitrarily. However, it may complicate the digital logic in the logic unit 4 and therefore reduce its speed. This is particularly important in high speed SAR ADCs where the digital logic is often implemented asynchronously.

Figure 3:
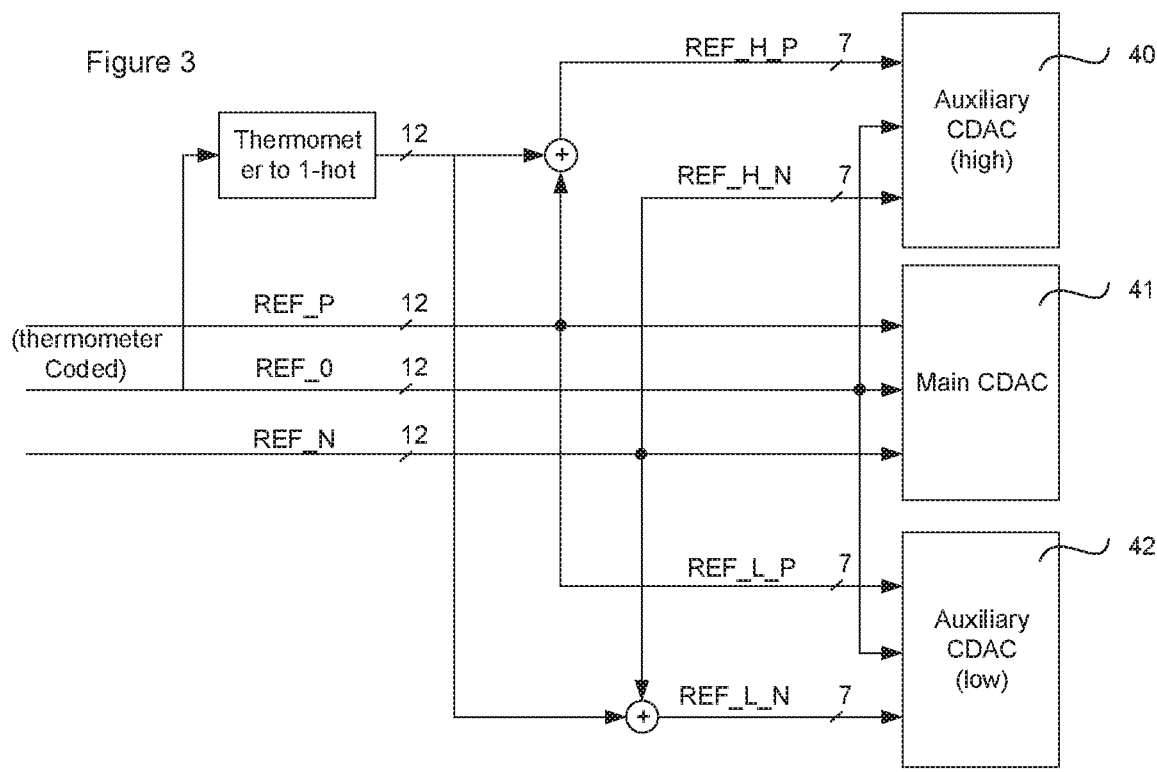
FIG. 3 illustrates a way of calculating control words for multiple sub-ADCs.

FIG. 3 shows a realization of the logic unit 4 which can reduce the overhead of producing control words for the coarse ("auxiliary") voltage generators ("CDACs"). This method relies on monotonic voltage generator encoding and assumes binary sizing of the voltage generator capacitors: i.e. each bit of the control word corresponds to a respective capacitor stage in the voltage generator. The circuit is arranged so that control words for the coarse/auxiliary voltage generators differ from the control word of the fine voltage generator in a single respective bit. This reduces any increase in delay of the critical path. FIG. 4 illustrates an example of this in operation. In a first step 50, CDAC 40 (see FIG. 3) makes a determination between 11 and 10 for the MSBs, CDAC 41 makes a determination between 10 and 01 and CDAC 42 makes a determination between 01 and 00. In FIG. 4 it is supposed the MSBs are determined to be 11. Then in the next step 51 similar logic is used to determine the next two MSBs. In FIG. 4 it is supposed the next MSBs are determined to be 01, giving 1101 for the four MSBs. This process can be repeated as shown.

Figure 5:
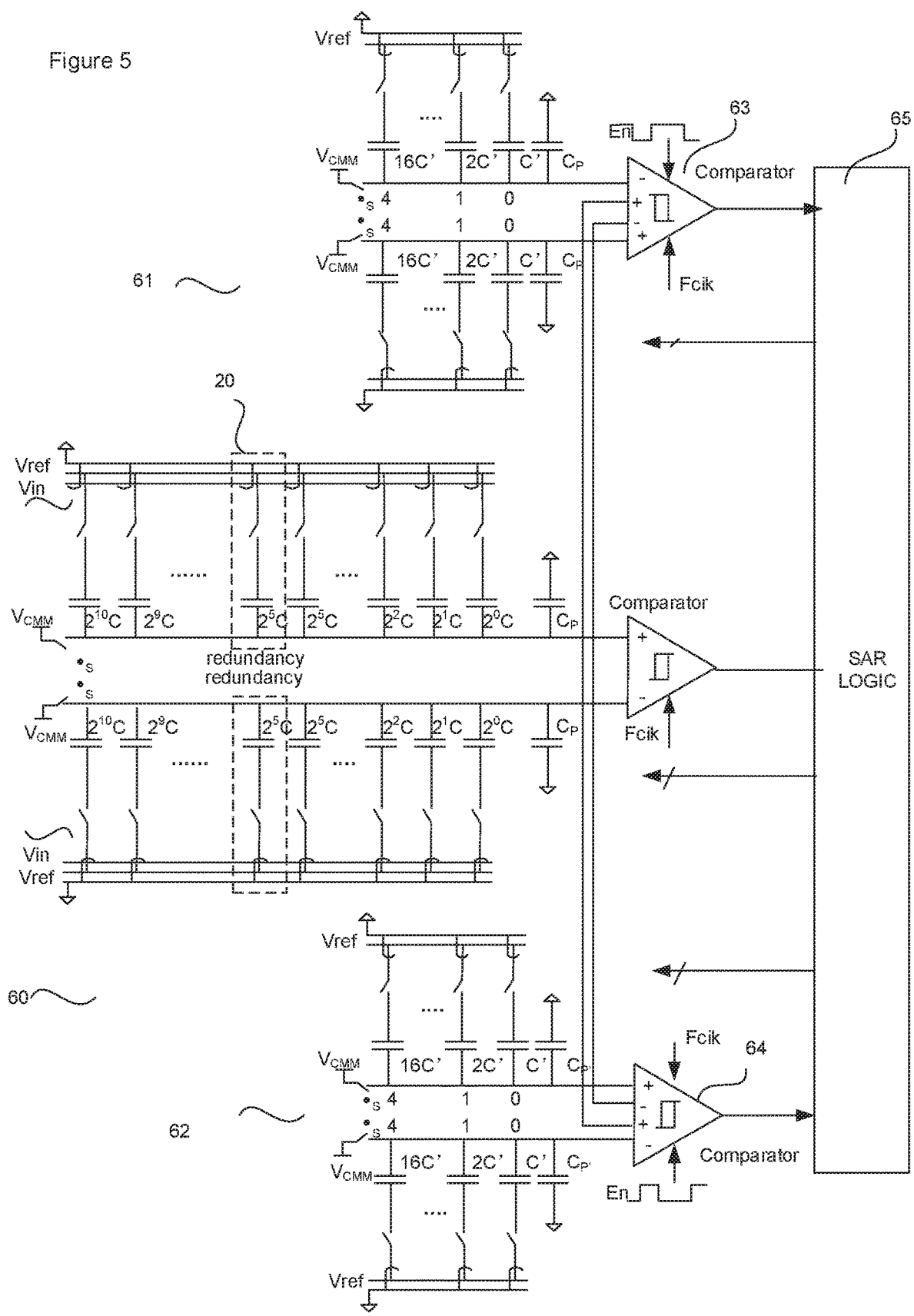
FIG. 5 shows another circuit for a multi-channel SAR ADC.

FIG. 5 shows an alternative embodiment of SAR ADC. In this embodiment, as for the embodiment of FIG. 1, the MSBs of the required digital value are determined first in a multi-bit parallel manner and then in a single-bit serial manner.

In the embodiment of FIG. 5, the input signal $V_{in}$ is sampled into the fine voltage generator 60 only. The auxiliary/coarse voltage generators 61, 62 serve to shift the sampled voltage by a desired amount, allowing the appropriate comparisons to be made at their comparators 63, 64 for estimating the required digital value. This approach can have a benefit of slightly reducing the input capacitance, and reducing complexity of the critical path in the control logic unit 65, because it only needs to drives the fine voltage generator 60. This approach employs auxiliary comparators 63, 64 that are arranged to compare the input signal $V_{in}$ against a reference signal. In the case where the comparison operates on differential signals this uses 4-input comparators as shown in FIG. 5. The control logic 65 decodes the result of a previous comparison and in dependence on that decoding calculates the next code word to be applied to the fine voltage generator 60. The control logic 65 produces fixed reference voltage offset values for the auxiliary voltage generators 61, 62 but since they are not dependent on the result of the previous comparison they need not affect the speed of the ADC. An example design for a four-input comparator of the type used in FIG. 5 is shown in FIG. 6.

In FIGS. 1 and 5 each capacitor is shown as a single capacitor device. It could be constituted by multiple capacitor devices in parallel and/or series.

In the examples described above the voltage generators are arranged in differential form, with two matching banks of capacitors. As is known in other forms of SAR DAC, one or more of the voltage generators could have a single bank of capacitors and could operate in a non-differential mode.

In the examples described above there are three voltage generators. There could be other numbers of voltage generators. For example, in a first stage three bits could be determined in parallel; then some voltage generators could be disabled and two bits could be determined in parallel; then all but one voltage generator could be disabled and that voltage generator could determine the remaining bit(s) of the digital output.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present application may consist of any such individual feature or combination of features. In view of the foregoing description it will be evident to a person skilled in the art that various modifications may be made within the scope of the application.

The invention claimed is:

1. An analogue to digital converter for generating a digital representation of the voltage of an input signal, the analogue to digital converter comprising:
   a plurality of voltage generators, each voltage generator having a control input and being capable of generating an output whose voltage is dependent on a signal applied to the control input;
   a comparison stage arranged to compare the input signal with one or more outputs of the voltage generators and generate one or more comparator outputs indicative of the result(s) of the comparison(s); and
   a controller arranged to receive the comparator outputs, the controller being configured to:
   (i) signal the control inputs of a number $V_1$ of the voltage generators to cause each of them to generate a respective output, and estimate in dependence on the resulting comparator outputs a number $B_1$ of bits of the digital representation; and subsequently
   (ii) signal the control input(s) of a number $V_2$ of the voltage generators to cause each of them to generate a respective output, and estimate in dependence on the resulting comparator output(s) a number $B_2$ of bits of the digital representation;
   wherein $V_2$ is less than $V_1$, and wherein the controller is further configured to perform the step (i) multiple times for a single input signal prior to performing the step (ii) for the same input signal, and to estimate different bits of the digital representation in each iteration of the step (i).

2. An analogue to digital converter as claimed in claim 1, wherein $B_2$ is less than $B_1$.

3. An analogue to digital converter as claimed in claim 2, wherein $B_1=B_2+1$.

4. An analogue to digital converter as claimed in claim 1, wherein $V_2$ is equal to 1.

5. An analogue to digital converter as claimed in claim 1, wherein $V_1=2^{B_1}-1$ and $V_2=2^{B_2}-1$.

6. An analogue to digital converter as claimed in claim 1, wherein the bits estimated in step (i) are more significant bits of the digital representation than the bits estimated in step (ii).

7. An analogue to digital converter as claimed in claim 1, wherein the controller is configured to, in step (i), cause the $V_1$ voltage generators to generate their respective outputs simultaneously.

8. An analogue to digital converter as claimed in claim 1, wherein the controller is configured to, between steps (i) and (ii), perform a step of signalling the control input(s) of a number $V_2$ of the voltage generators to cause each of them to generate a respective output, and in dependence on the resulting comparator output(s) compensate for any offset between that or those voltage generators and voltage generators employed in step (i).

9. An analogue to digital converter as claimed in claim 1, wherein the comparison stage comprises a plurality of comparators, each comparator being arranged to compare the input signal with the output of a respective one of the voltage generators.

10. An analogue to digital converter as claimed in claim 1, wherein the or each voltage generator employed in step (ii) is/are less power efficient than the or each voltage generator employed in step (i) and not in step (ii).

11. An analogue to digital converter as claimed in claim 1, wherein the or each voltage generator employed in step (ii) is/are more precise than the or each voltage generator employed in step (i) and not in step (ii).

12. An analogue to digital converter as claimed in claim 1, wherein the or each voltage generator employed in step (ii) is/are capable of generating voltages at finer resolution than the or each voltage generator employed in step (i) and not in step (ii).

13. An analogue to digital converter as claimed in claim 1, wherein the controller is configured to set the or each voltage generator employed in step (i) and not in step (ii) in a quiescent state during step (ii).

14. An analogue to digital converter as claimed in claim 1, the controller being configured to perform the step (ii) multiple times for a single input signal after performing the step (i) for the same input signal, and to estimate different bits of the digital representation in each iteration of the step (ii).

15. A signal receiver comprising a radio frequency input and a sampling circuit for periodically sampling the voltage of a received signal derived from the radio frequency input, the sampling circuit comprising:
   a plurality of buffers for storing respective samples of the received signal at respective times; and
   a plurality of analogue to digital converters for generating a digital representation of a voltage of an input signal, each analogue to digital converter being configured to take the content of a respective buffer as its input signal,
   wherein each of the plurality of analogue to digital converter comprises:
      a plurality of voltage generators, each voltage generator having a control input and being capable of generating an output whose voltage is dependent on a signal applied to the control input;
      a comparison stage arranged to compare the input signal with one or more outputs of the voltage generators and generate one or more comparator outputs indicative of the result(s) of the comparison(s); and
      a controller arranged to receive the comparator outputs, the controller being configured to:
         (i) signal the control inputs of a number V1 of the voltage generators to cause each of them to generate a respective output, and estimate in dependence on the resulting comparator outputs a number B1 of bits of the digital representation; and subsequently
         (ii) signal the control input(s) of a number V2 of the voltage generators to cause each of them to generate a respective output, and estimate in dependence on the resulting comparator output(s) a number B2 of bits of the digital representation;
      wherein V2 is less than V1.

16. A method for generating a digital representation of the voltage of an input signal in an analogue to digital converter comprising:
   a plurality of voltage generators, each voltage generator having a control input and being capable of generating an output whose voltage is dependent on a signal applied to the control input; and
   a comparison stage arranged to compare the input signal with one or more outputs of the voltage generators and generate one or more comparator outputs indicative of the result(s) of the comparison(s);
the method comprising:
   (i) signalling the control input(s) of a number $V_1$ of the voltage generators to cause each of them to generate a respective output, and estimating in dependence on the resulting comparator output(s) a number $B_1$ of bits of the digital representation; and subsequently
   (ii) signalling the control input(s) of a number $V_2$ of the voltage generators to cause each of them to generate a respective output, and estimating in dependence on the resulting comparator output(s) a number $B_2$ of bits of the digital representation;
   wherein $V_2$ is less than $V_1$, and wherein the method further comprises: performing the step (i) multiple times for a single input signal prior to performing the step (ii) for the same input signal, and estimating different bits of the digital representation in each iteration of the step (i).

* * * * *